US007955764B2

(12) United States Patent
Liu et al.

(10) Patent No.: US 7,955,764 B2
(45) Date of Patent: Jun. 7, 2011

(54) METHODS TO MAKE SIDEWALL LIGHT SHIELDS FOR COLOR FILTER ARRAY

(75) Inventors: Saijin Liu, Boise, ID (US); Ulrich C. Boettiger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1084 days.

(21) Appl. No.: 11/785,545

(22) Filed: Apr. 18, 2007

(65) Prior Publication Data

US 2007/0237888 A1    Oct. 11, 2007

Related U.S. Application Data

(63) Continuation-in-part of application No. 11/399,314, filed on Apr. 7, 2006, now abandoned.

(51) Int. Cl.
*G02B 5/20* (2006.01)
(52) U.S. Cl. .............................. 430/7; 430/319; 430/321
(58) Field of Classification Search .................... None
See application file for complete search history.

(56) References Cited

U.S. PATENT DOCUMENTS

| | | | |
|---|---|---|---|
| 3,971,065 A | 7/1976 | Bayer |
| 6,140,630 A | 10/2000 | Rhodes |
| 6,204,524 B1 | 3/2001 | Rhodes |
| 6,310,366 B1 | 10/2001 | Rhodes et al. |
| 6,326,652 B1 | 12/2001 | Rhodes |
| 6,333,205 B1 | 12/2001 | Rhodes |
| 6,376,868 B1 | 4/2002 | Rhodes |
| 6,724,425 B1 | 4/2004 | Moon et al. |
| 6,852,591 B2 | 2/2005 | Rhodes |
| 2003/0063204 A1 | 4/2003 | Suda |
| 2006/0027887 A1 | 2/2006 | Boettiger et al. |
| 2006/0081898 A1 | 4/2006 | Wang et al. |
| 2006/0158547 A1 | 7/2006 | Komatsu et al. |
| 2006/0169878 A1 | 8/2006 | Kasano et al. |
| 2007/0007443 A1 | 1/2007 | Takeuchi |
| 2007/0040102 A1 | 2/2007 | Mouli |
| 2007/0045685 A1 | 3/2007 | Yang et al. |
| 2007/0046796 A1 | 3/2007 | McKee |
| 2007/0096232 A1* | 5/2007 | Hwang .................. 257/431 |
| 2007/0188635 A1 | 8/2007 | Yamaguchi et al. |
| 2007/0206241 A1 | 9/2007 | Smith et al. |
| 2008/0049126 A1 | 2/2008 | Ford et al. |

FOREIGN PATENT DOCUMENTS

JP    60-178404    9/1985

OTHER PUBLICATIONS

International Search Report and Written Opinion, Oct. 17, 2008.
International Preliminary Report on Patentability issued by the International Bureau on Oct. 29, 2009.

* cited by examiner

*Primary Examiner* — John A. McPherson
(74) *Attorney, Agent, or Firm* — Dickstein Shapiro LLP

(57) ABSTRACT

Methods of forming color filters having a light blocking material therebetween. A color filter is formed such that a trench is defined between a color filter and an adjacent color filter. The trench may be formed by exposing the color filter to polymerizing conditions such as, for example, ultraviolet radiation and heat. The trench may also be formed by etching between adjacent color filters. A material is formed within the trench.

16 Claims, 18 Drawing Sheets

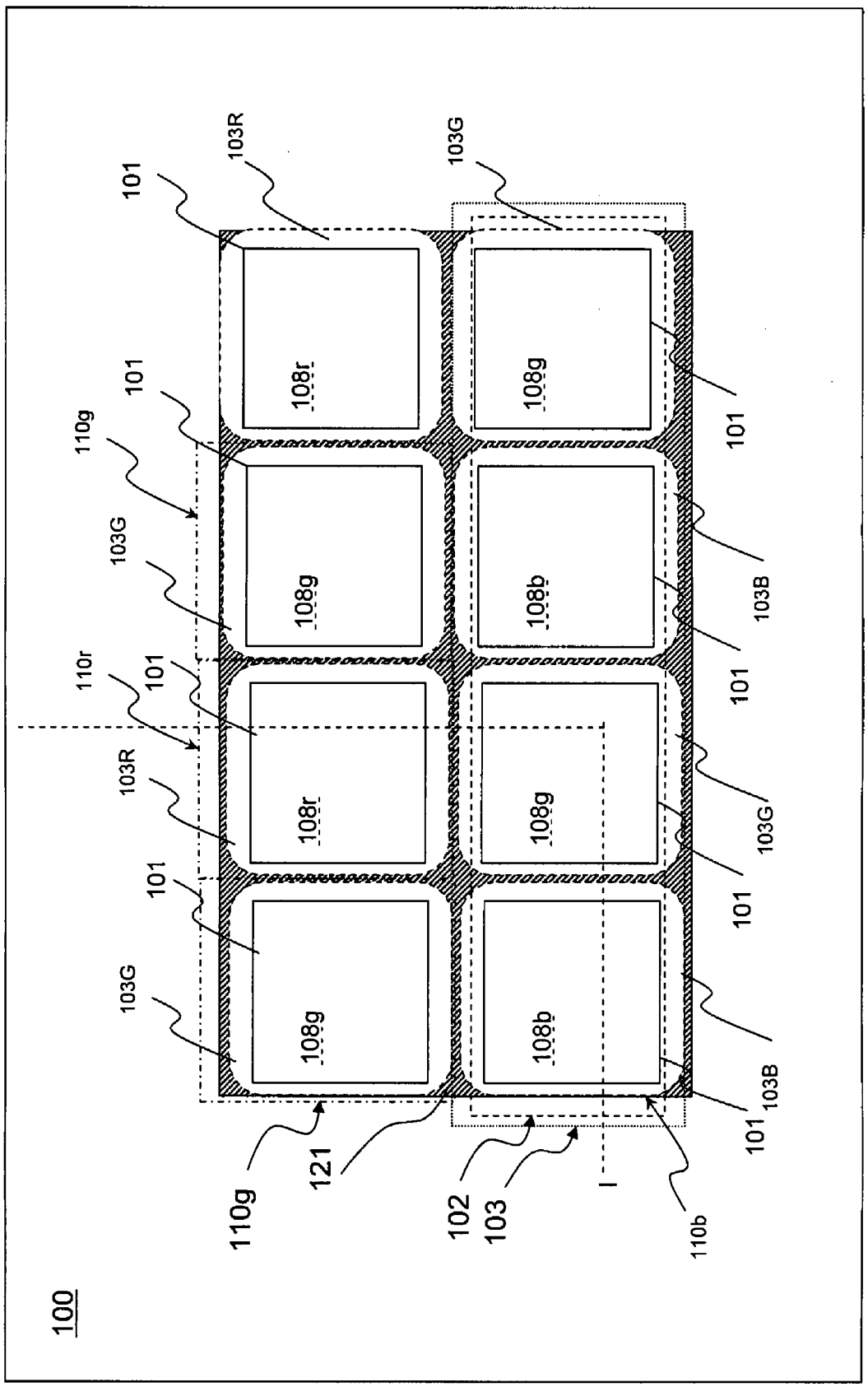

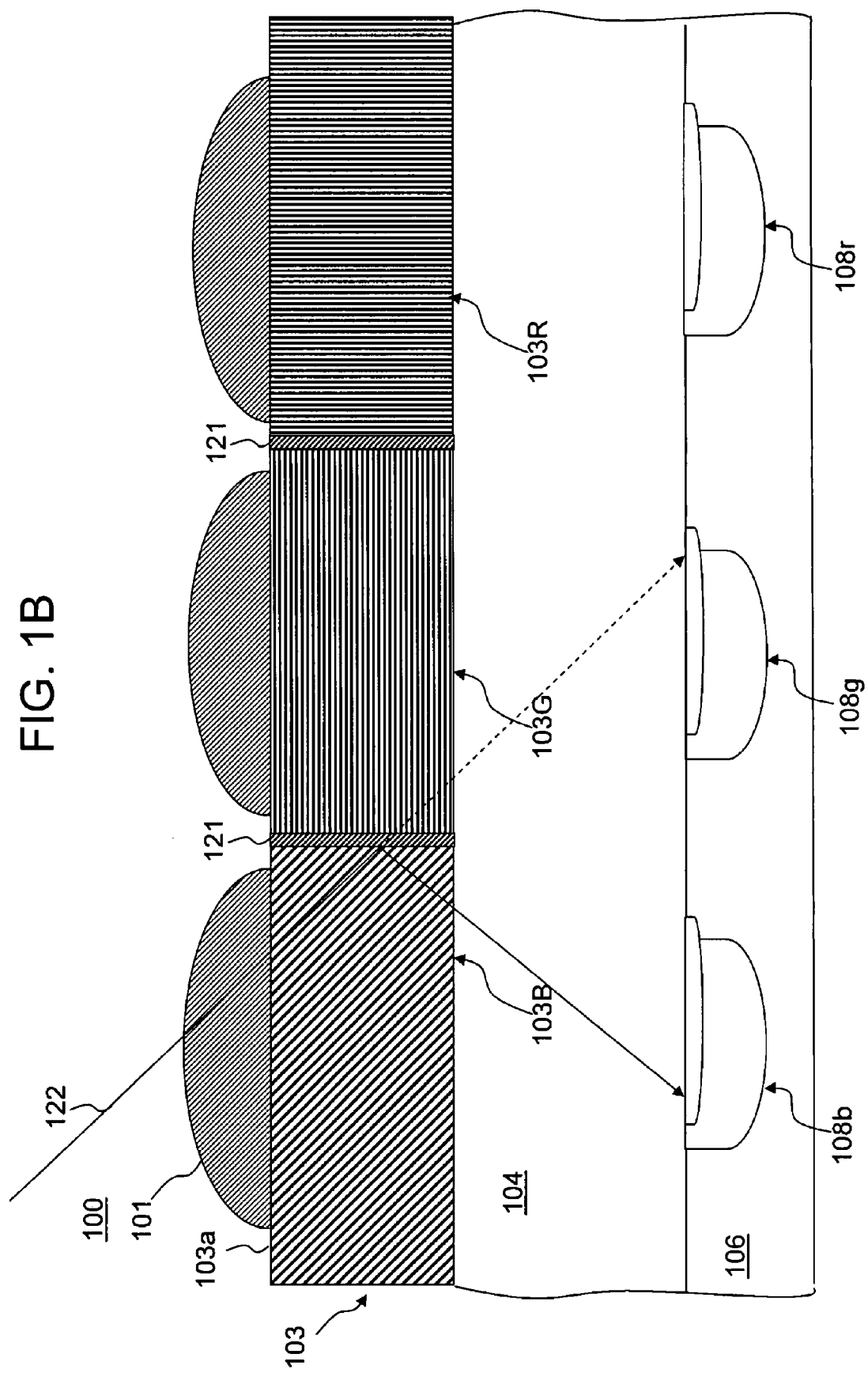

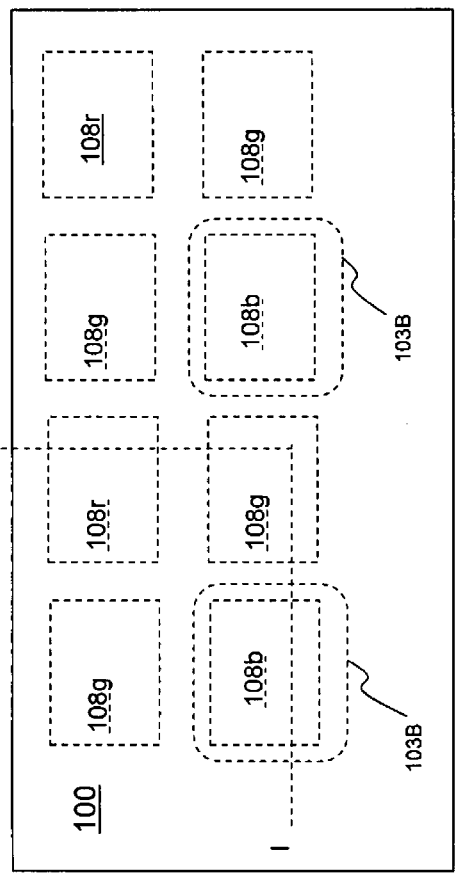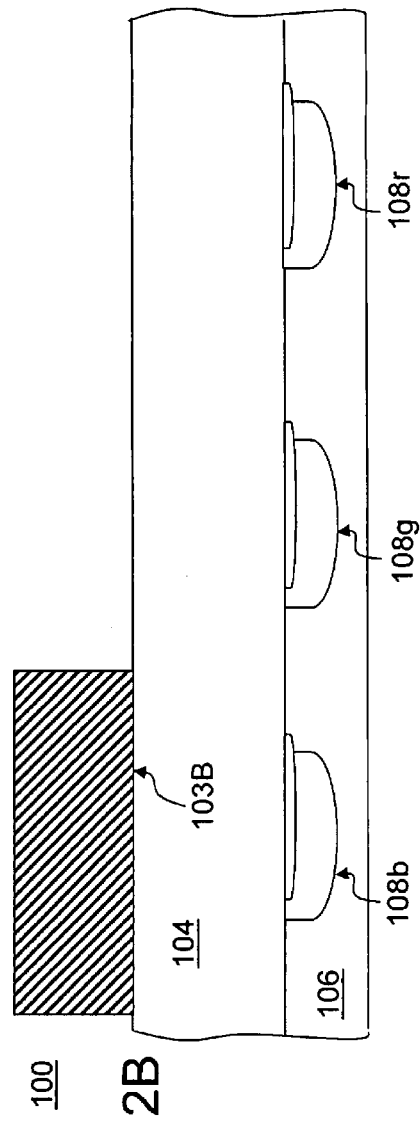

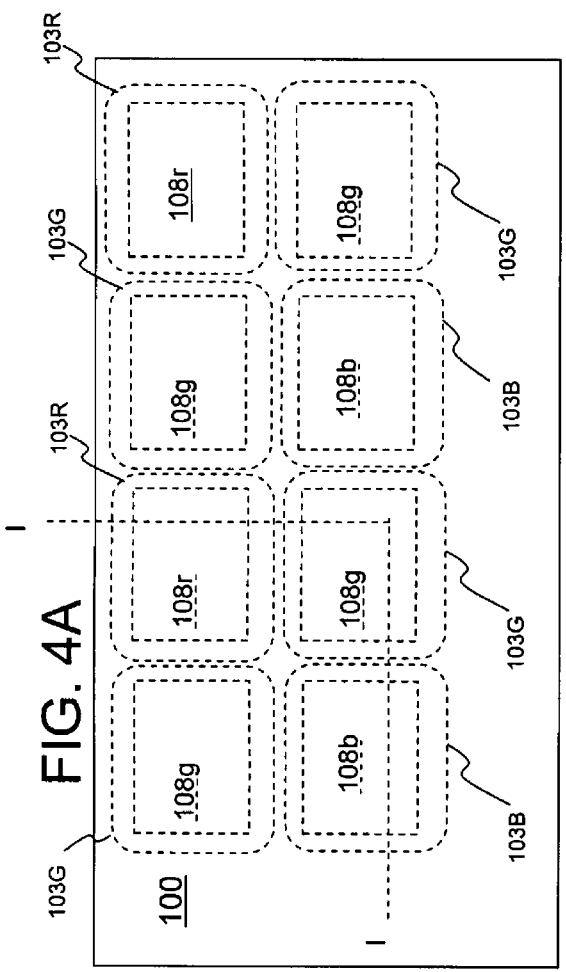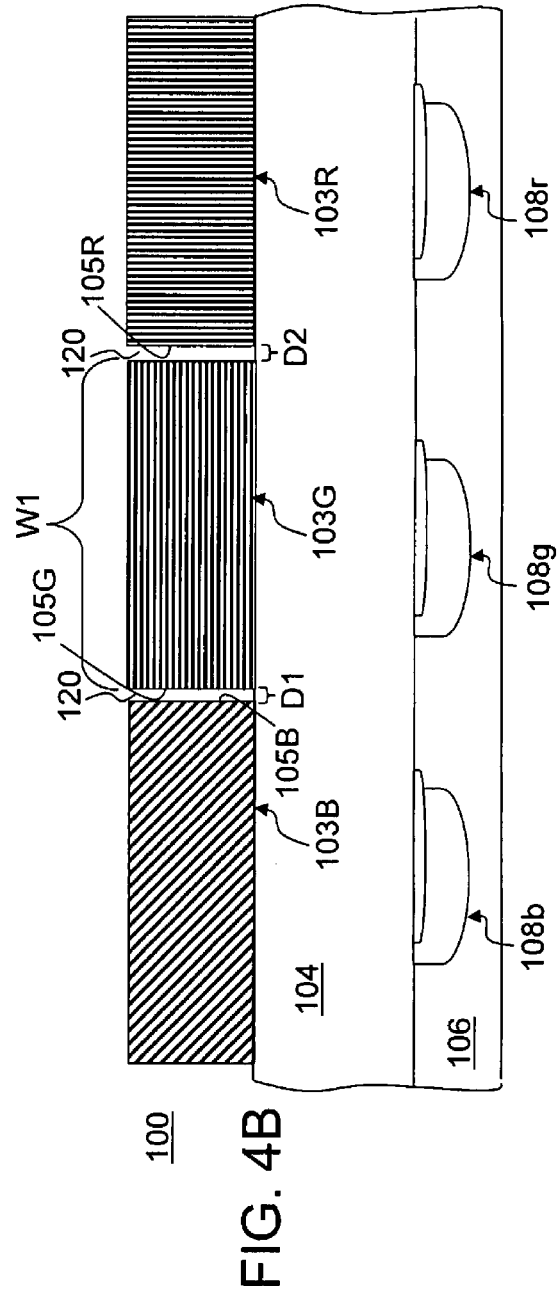

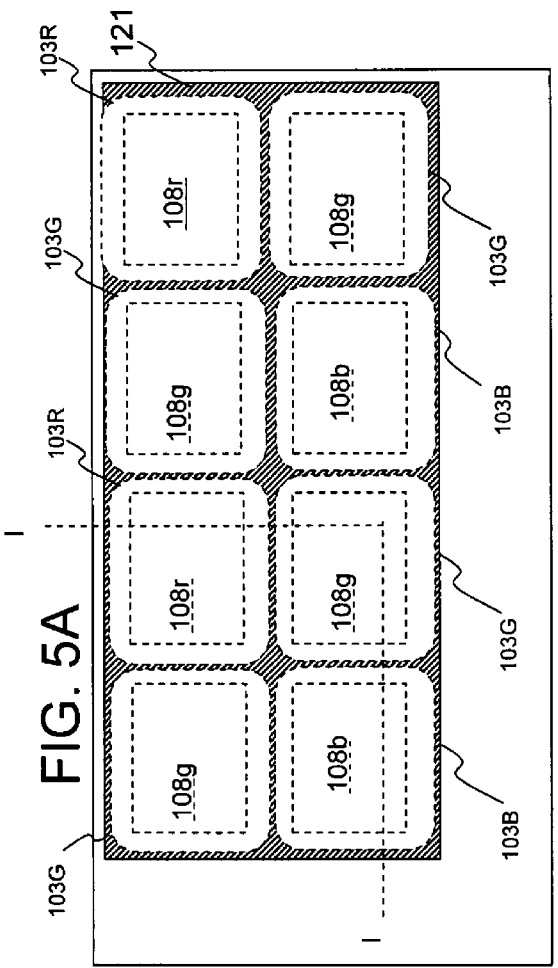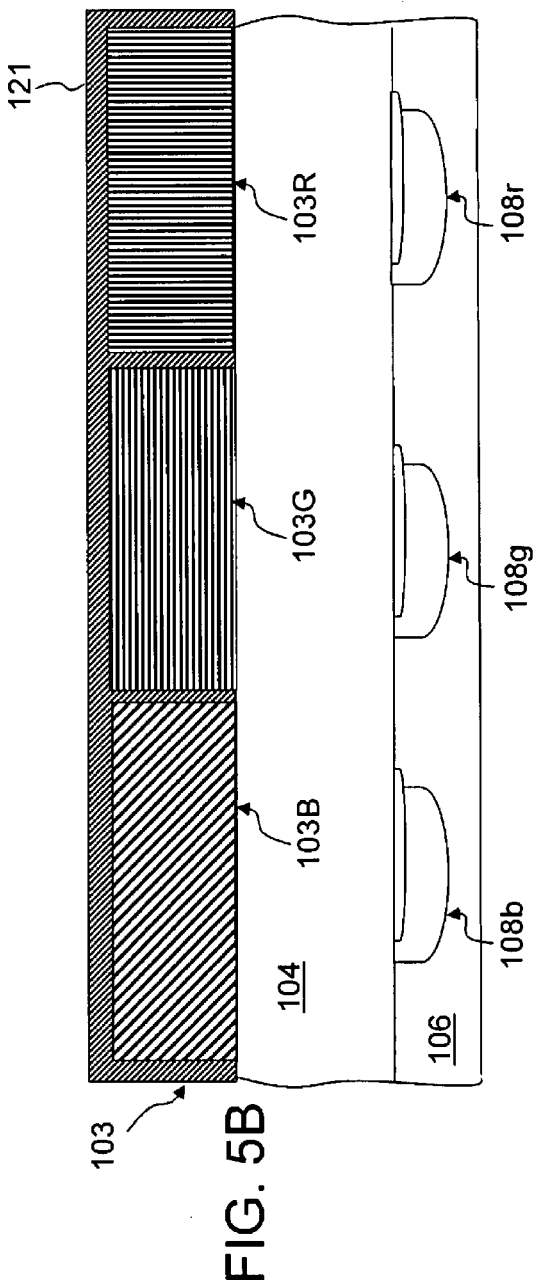

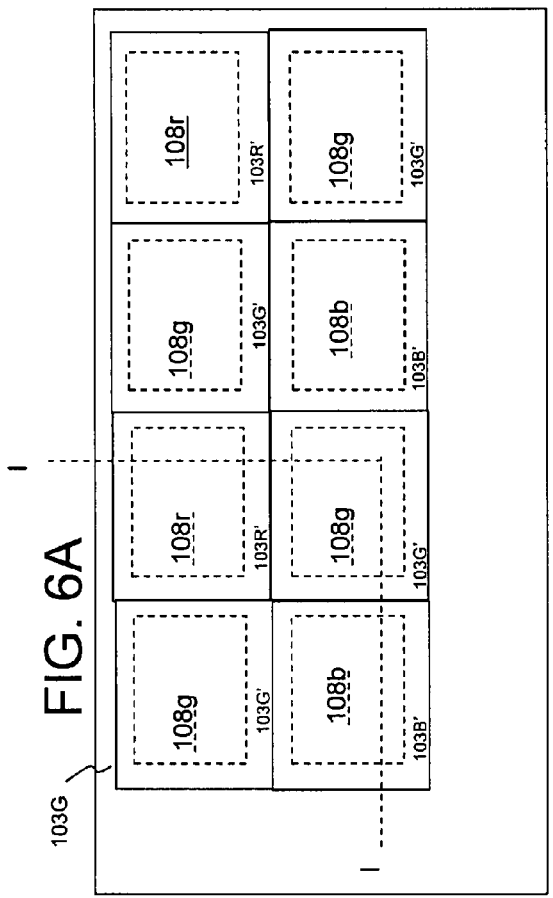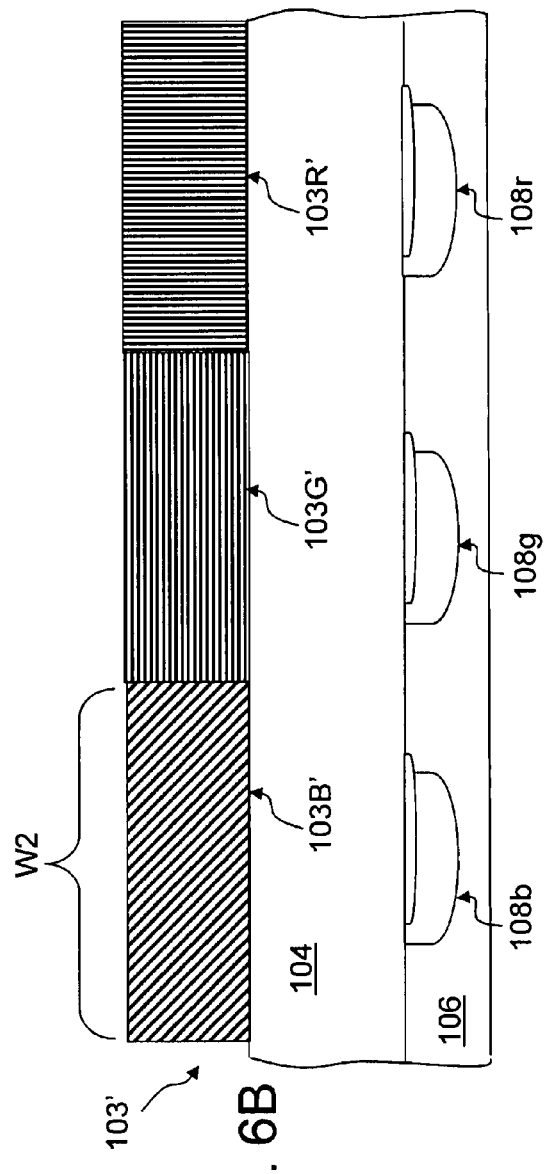

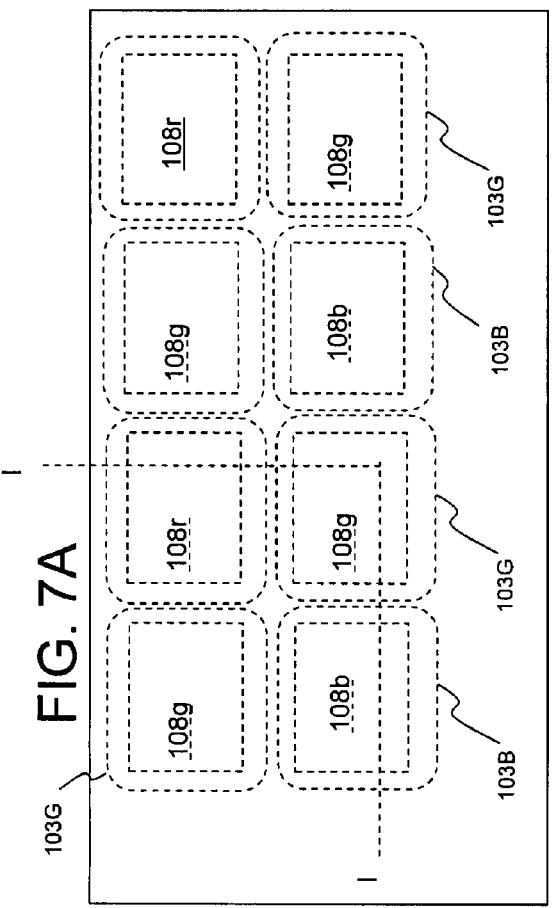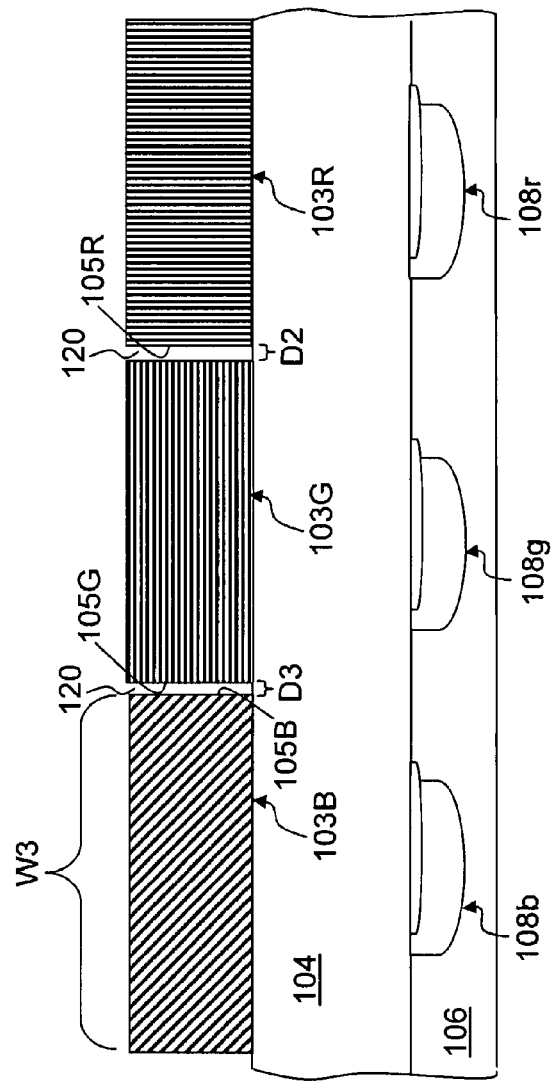

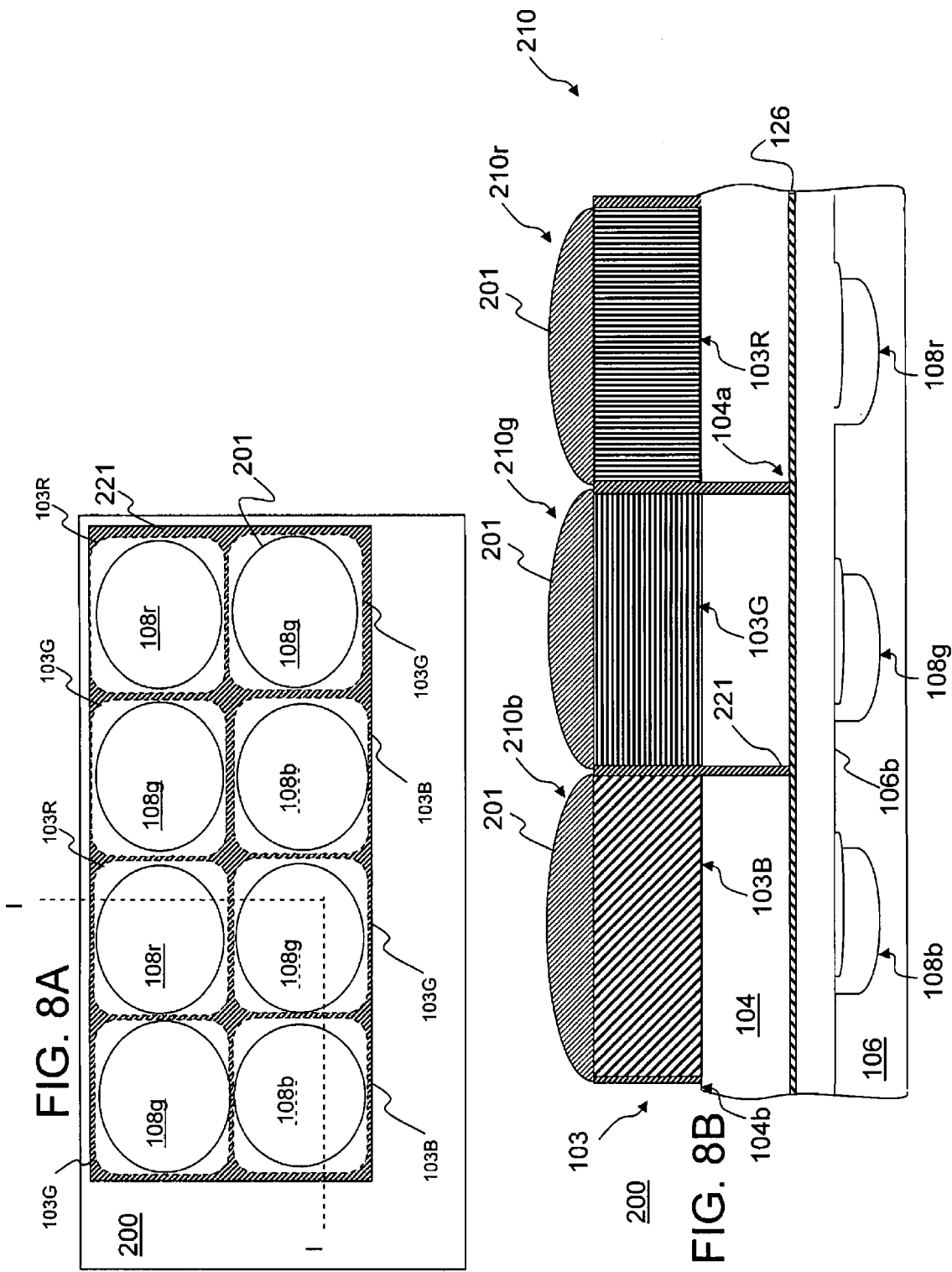

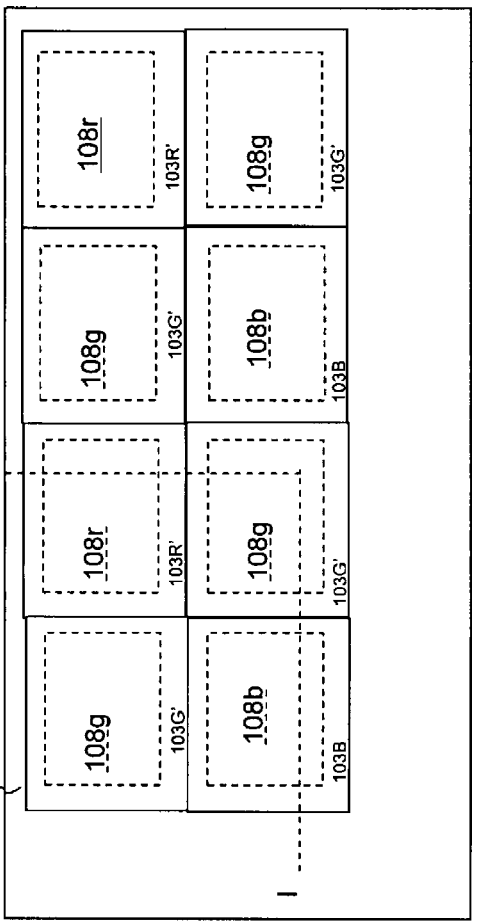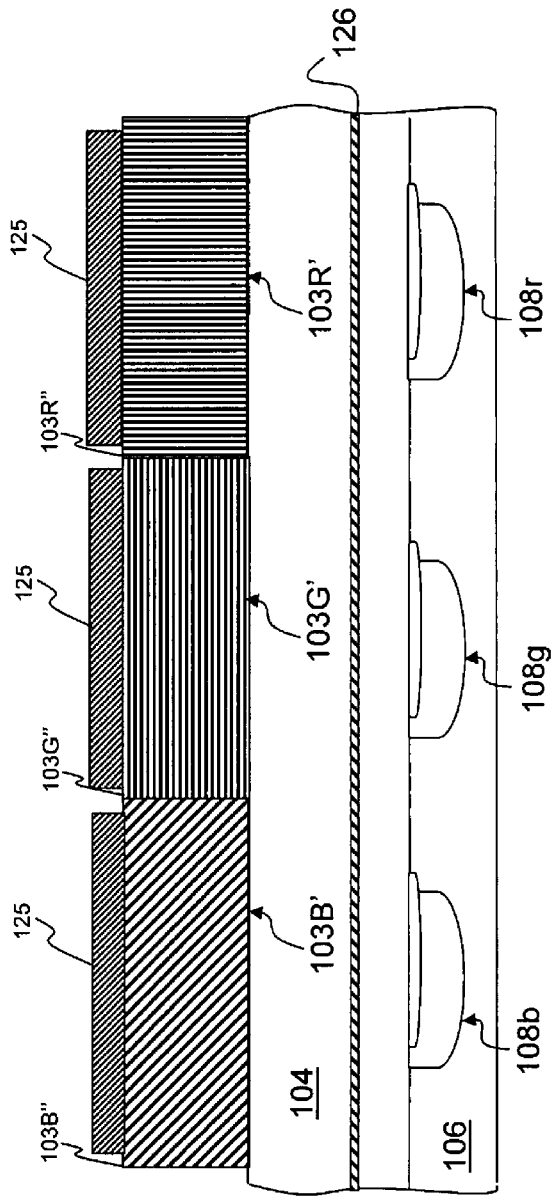

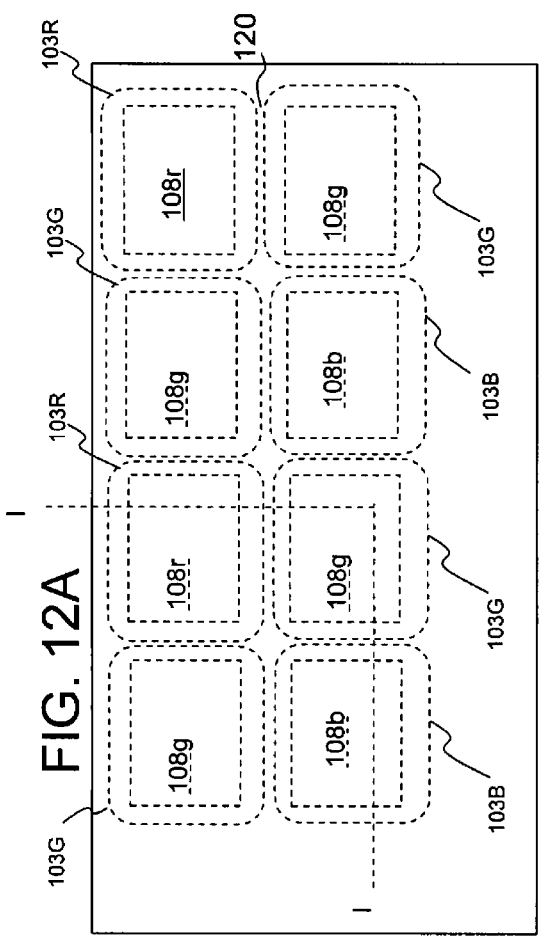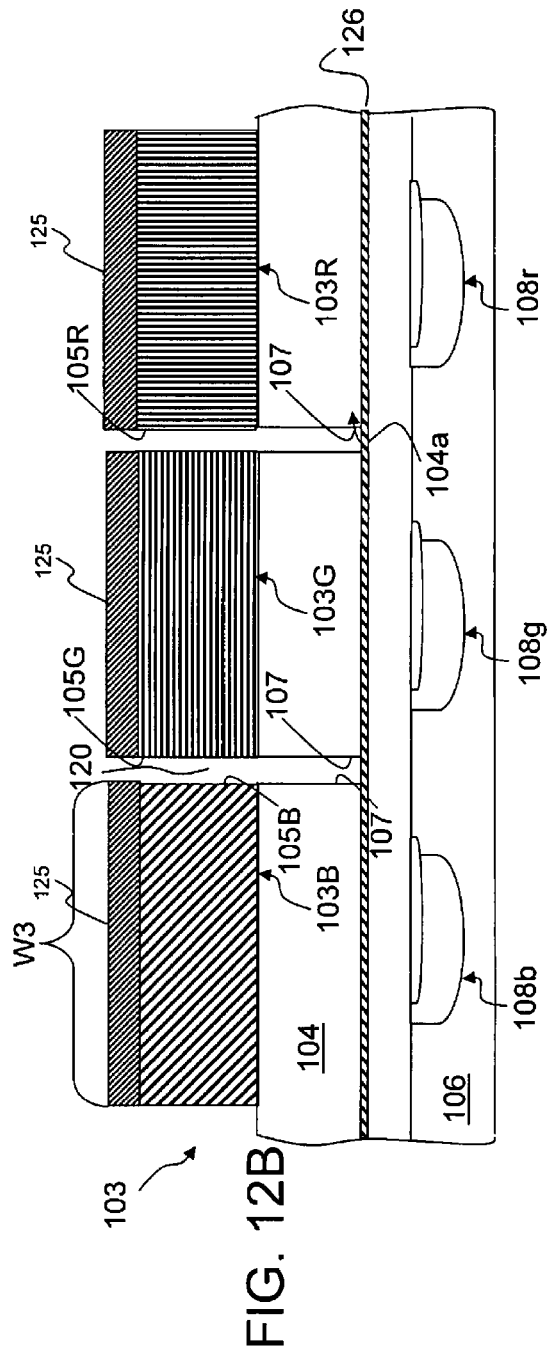

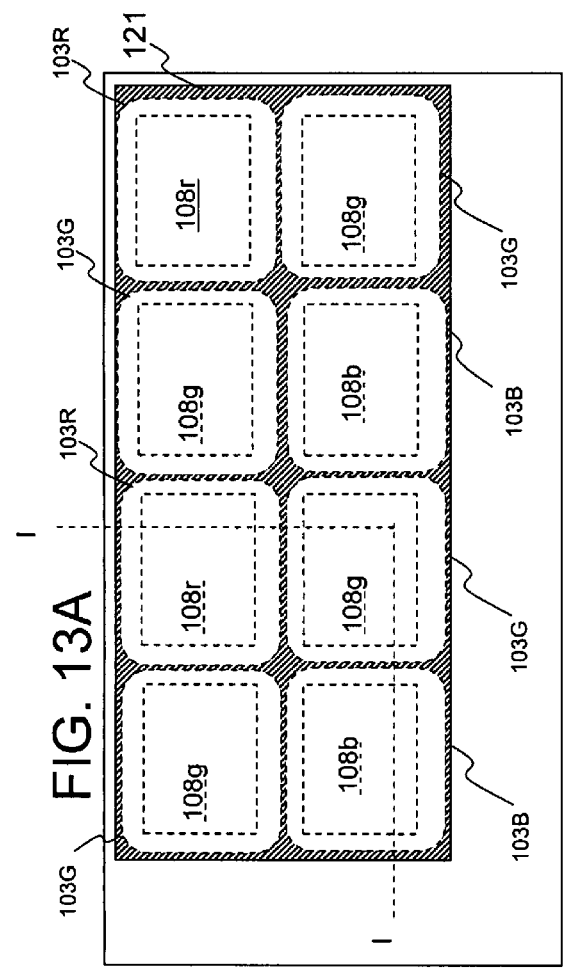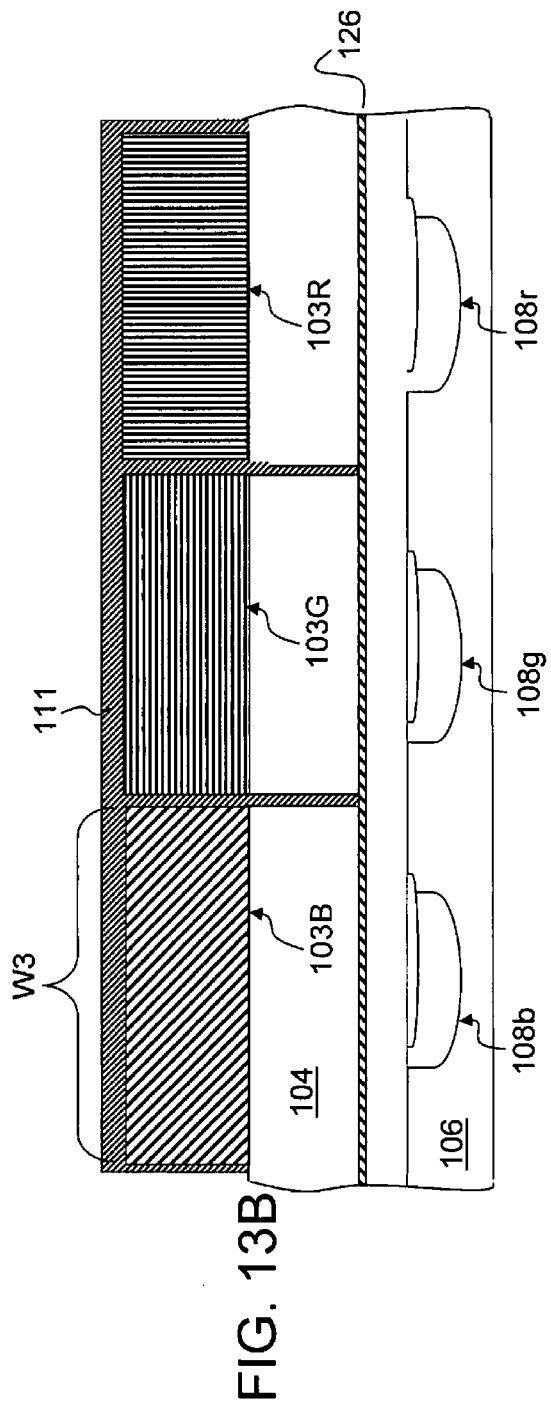

US 7,955,764 B2

METHODS TO MAKE SIDEWALL LIGHT SHIELDS FOR COLOR FILTER ARRAY

CROSS-REFERENCE TO RELATED APPLICATIONS

This application is a continuation-in-part of application Ser. No. 11/399,314, filed Apr. 7, 2006, now abandoned which is hereby incorporated by reference.

FIELD OF THE INVENTION

Embodiments described herein relate to methods of forming color filters for use in a solid-state image sensor having a structure that isolates individual features from one another.

BACKGROUND OF THE INVENTION

Solid-state image sensors were developed in the late 1960s and early 1970s primarily for television image acquisition, transmission, and display. An imager absorbs incident radiation of a particular wavelength (such as optical photons, x-rays, or the like) and generates an electrical signal corresponding to the absorbed radiation. There are a number of different types of semiconductor-based imagers, including charge coupled devices (CCDs), photodiode arrays, charge injection devices (CIDs), hybrid focal plane arrays, and complementary metal oxide semiconductor (CMOS) imagers. Current applications of solid-state imagers include cameras, scanners, machine vision systems, vehicle navigation systems, star trackers, and motion detector systems, among other uses.

These imagers typically consist of an array of pixels containing photosensors, where each pixel produces a signal corresponding to the intensity of light impinging on its photosensor when an image is focused on the array. These signals may then be stored, for example, for later display, printing, or analysis or are otherwise used to provide information about the image. The photosensors may be phototransistors, photogates, photodiodes, or other light sensitive devices. The magnitude of the signal produced by each pixel is proportional to the amount of light impinging on the photo sensor.

To allow the photosensors to capture a color image, the photosensors must be able to separately detect color components for a captured image. For example, in a well known Bayer pattern photosensor array red (R) photons, green (G) photons, and blue (B) photons are captured by different pixel cells of the array. Accordingly, each pixel must be sensitive only to one color or spectral band. For this, a color filter array (CFA) is typically placed in front of the optical path to the photosensors so that each photosensor detects the light of the color of its associated filter. Thus, for an exemplary Bayer pattern photosensor array, each photosensor is covered with either a red, green, or blue filter, according to a specific pattern.

As noted, color filter arrays are commonly arranged in a mosaic sequential pattern of red, green, and blue filters known as a Bayer filter pattern. The Bayer filter pattern is quartet-ordered with successive rows that alternate red and green filters, then green and blue filters. Thus, each red filter is surrounded by four green and four blue filters, while each blue filter is surrounded by four red and four green filters. In contrast, each green filter is surrounded by two red, four green, and two blue filters. U.S. Pat. No. 3,971,065 to Bayer describes the Bayer pattern color filter array.

Forming a color filter array requires multistep fabrication process that can be complex and difficult to implement to obtain good separation of the color filters. Accordingly, there is a need and desire for improved methods of forming color filter arrays.

BRIEF DESCRIPTION OF THE DRAWINGS

FIGS. 1A and 1B illustrate partial top-down and cross-sectional views of an imager constructed in accordance with a first structural embodiment discussed herein.

FIGS. 2A-5B illustrate partial top-down and cross-sectional views of a first fabrication embodiment for forming the imager illustrated in FIGS. 1A and 1B.

FIGS. 6A-7B illustrate partial top-down and cross-sectional views of a second fabrication embodiment for forming the imager illustrated in FIGS. 1A and 1B.

FIGS. 8A and 8B illustrate partial top-down and cross-sectional views of an imager constructed in accordance with a second structural embodiment discussed herein.

FIGS. 9A-13B illustrate partial top-down and cross-sectional views of a fabrication embodiment for forming the imager illustrated in FIGS. 8A and 8B.

DETAILED DESCRIPTION OF THE INVENTION

Figure 3A:
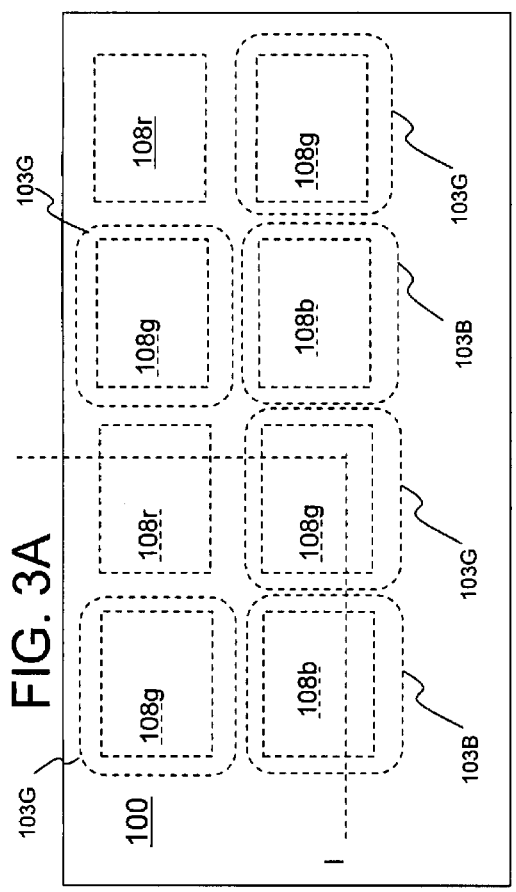

In the following detailed description, reference is made to various specific embodiments. These embodiments are described with sufficient detail to enable those skilled in the art to practice the invention, and it is to be understood that other embodiments may be employed, and that structural and electrical changes may be made.

The term "substrate" used in the following description may include any supporting structure including, but not limited to, a semiconductor substrate that has a substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate or wafer in the following description, previous process steps may have been utilized to form regions or junctions in or over the base semiconductor or foundation. The substrate also need not be semiconductor-based, but may be any support structure suitable for supporting an integrated circuit, including, but not limited to, metals, alloys, glasses, polymers, ceramics, and any other supportive materials as is known in the art.

The term "pixel" or "pixel cell" refers to a picture element unit cell containing a photo-conversion device for converting electromagnetic radiation to an electrical signal. For purposes of illustration, a representative three-color Bayer R, G, B pixel array is described herein; however, the embodiments of the invention are not limited to the use of an R, G, B array, and can be used with other color arrays, one example being C, M, Y, K (which represents cyan, magenta, yellow, and black color filters). Also, for purposes of illustration, a portion of a representative pixel is illustrated in the figures and description herein, and typically fabrication of other pixel cells in an imager will proceed concurrently and in a similar fashion.

Embodiments described herein relate to methods of forming color filters for use in a solid-state image sensor. Although the embodiments of the invention are described in relation to use with a CMOS imager, they are not so limited and have applicability to any solid-state imager.

Referring now to the drawings, where like elements are designated by like numerals, FIGS. 1A and 1B illustrate a partial top-down view and side cross-sectional view (taken along line I-I of FIG. 1A), respectively, of a portion of a semiconductor-based imager 100, such as a CMOS imager, constructed in accordance with a first structural embodiment.

As illustrated in FIG. 1A, the imager 100 includes a plurality of pixel cells including first, second, and third pixel cells 110b, 110g, 110r. The first, second, and third pixel cells 110b, 110g, 110r include a microlens array 102 having microlenses 101 formed over corresponding first, second, and third color filters 103B, 103G, 103R in the color filter array 103. The color filter array 103 is illustrated as having a Bayer pattern; although, as noted, this is not intended to be limiting. Each of the first, second, and third color filters 103B, 103G, 103R allows a particular wavelength of light to pass through to corresponding first, second, and third photosensors 108b, 108g, 108r formed in a semiconductor substrate 106 (FIG. 1B) formed below intervening fabrication layers 104 (FIG. 1B) including passivation and metallization layers.

The color filter array 103 also includes a light blocking material layer 121 formed between the first, second, and third color filters 103B, 103G, 103R in the color filter array 103. As illustrated in FIG. 1B, off-axis light 122 incident upon the imager 100 and intended for capture by the first photosensor 108b would strike the adjacent photosensor 108g (as shown by the dashed line) if the material layer 121 were not provided. By providing the material layer 121 between the first and second color filters 103B, 103G, however, the off-axis light 122 is prevented from striking the second photosensor 108g thereby reducing the amount of optical cross talk between photosensors (e.g., first, second, and third photosensors 108b, 108g, 108r). The material layer 121 thereby acts as a light shield between the photosensors.

The problem of optical cross talk is exacerbated by asymmetrical pixel cell architectures that have recently been proposed to increase photosensor array density. Asymmetrical pixel cell architecture demands the precise placement of color filters and overlying microlenses to focus light onto the photosensors. Misalignment of the color filter array and overlying microlenses may have detrimental effects caused by an increase in the incidence of cross talk.

In addition to decreasing the incidence of cross talk, the illustrated material layer 121 of FIGS. 1A and 1B may also increase the percentage of off-axis light 122 that is captured by the intended first photosensor 108b by reflecting the off-axis light 122 onto the intended first photosensor 108b, thereby increasing the quantum efficiency of the pixel cell.

FIGS. 2A-5B illustrate a first fabrication embodiment for forming the imager 100 illustrated in FIGS. 1A and 1B. As illustrated in FIGS. 2A and 2B, which are partial top-down and side cross-sectional views, respectively, the first color filter 103B is selectively deposited, patterned, and baked on a planarized upper surface of fabrication layer 104 and over respective first photosensors 108b of the imager 100.

The first color filter 103B is formed of any transparent material that allows wavelengths of light (e.g., blue light) to pass through. For example, the first color filter 103B could be formed of zinc selenide (ZnSe), silicon oxide, silicon nitride, silicon oxynitride, silicon-carbon (SiC) (BLOk), tantalum pentoxide (Ta$_2$O$_5$), titanium oxide (TiO$_2$), polymethylmethacrylate, polycarbonate, polyolefin, cellulose acetate butyrate, polystyrene, polyimide, epoxy resin, photosensitive gelatin, acrylate, methacrylate, urethane acrylate, epoxy acrylate, polyester acrylate, or a positive or negative photoresist such as a 3000 series photoresist material (or any other series of photoresist material) produced by FUJIFILM Electronic Materials (FFEM), Japan, including, but not limited to color resists known in the art as SB-3000L, SG-3000L and SR-3000L for blue, green, and red color filters, respectively. The first color filter 103B could also be formed of a material including, but not limited to, glass, for example, zinc selenide (ZnSe), boro-phospho-silicate glass (BPSG), phosphosilicate glass (PSG), borosilicate glass (BSG), silicon oxide, silicon nitride, or silicon oxynitride; an optical thermoplastic material such as tantalum pentoxide (Ta2O5), titanium oxide (TiO2), polymethylmethacrylate, polycarbonate, polyolefin, cellulose acetate butyrate, or polystyrene; a polyimide; a thermoset resin such as an epoxy resin; a photosensitive gelatin; or a radiation curable resin such as acrylate, methacrylate, urethane acrylate, epoxy acrylate, or polyester acrylate. The preceding materials are only illustrative examples.

Figure 3B:
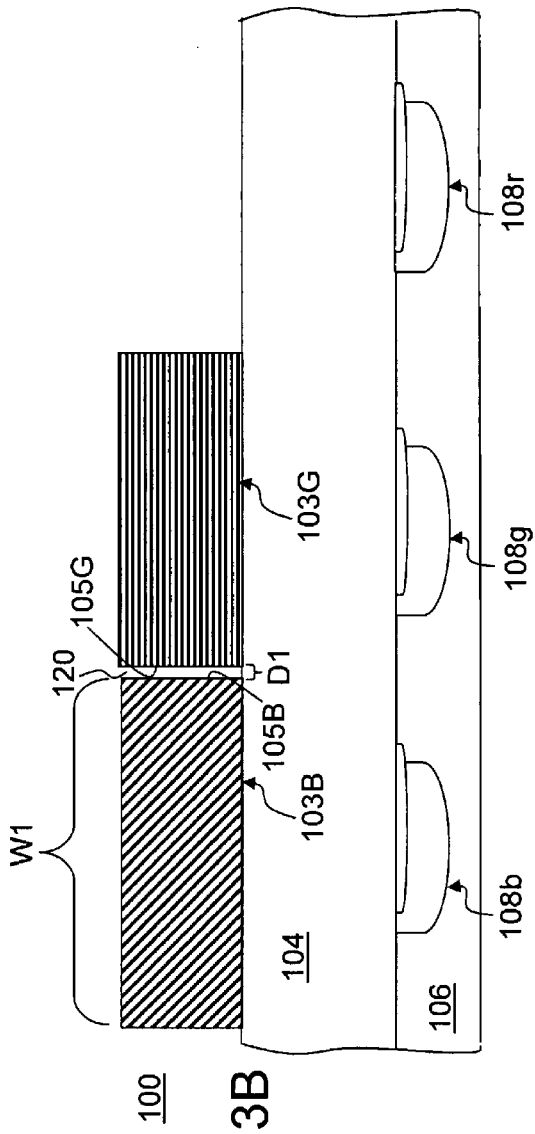

FIGS. 3A and 3B illustrate partial top-down and side cross-sectional views, respectively, of the second color filter 103G being selectively deposited, patterned, and baked over respective second photosensors 108g of the imager 100. The second color filter 103G can be formed of any of the materials listed above with respect to the first color filter 103B.

The second color filter 103G is formed adjacent, but not touching, the first color filter 103B, thereby defining a trench 120. The illustrated first and second color filters 103B, 103G could each have a width W1 in the range from about 1000 nm to about 2000 nm, and separated from one another by a distance D1 in the range from about 50 nm to about 200 nm, although the range is not intended to be limiting. By forming the first and second color filters 103B, 103G apart from one another, sidewall regions 105B, 105G of the first and second color filters 103B, 103G, respectively, are exposed for further processing, as discussed below with respect to FIGS. 5A and 5B.

FIGS. 4A and 4B illustrate partial top-down and side cross-sectional views, respectively, of the third color filter 103R being selectively deposited, patterned, and baked over respective third photosensors 108r of the imager 100. The third color filter 103R can be formed of any of the materials listed above with respect to the first color filter 103B.

The third color filter 103R is formed adjacent to, but not touching, the second color filter 103G, thereby defining another trench 120. The illustrated second and third color filters 103G, 103R could each have a width W1 in the range from about 1000 nm to about 2000 nm, and separated from one another by a distance D2 in the range from about 50 nm to about 200 nm, although the range is not intended to be limiting. By forming the second and third color filters 103G, 103R apart from one another, sidewall regions 105G, 105R of each second and third color filters 103G, 103R, respectively, are exposed.

Although FIGS. 2A-4B illustrate the deposition, patterning, and baking of first, second, and third color filters 103B, 103G, 103R in succession, it is not intended to be limiting. As discussed below with respect to FIGS. 6A-7B, the processing of first, second, and third color filters 103B, 103G, 103R can occur simultaneously. It should also be noted that the order of forming the first second, and third color filters 103B, 103G, 103R is not important; for example, although illustrated as forming the first color filter corresponding to a blue color filter, the first color filter could be any desired color such as green or red, or any other desired color.

FIGS. 5A and 5B illustrate partial top-down and side cross-sectional views, respectively, of a material layer 121 formed over the exposed sidewall regions 105B, 105G, 105R (FIGS. 3A-4B), and between and over each of the first, second, and third color filters 103B, 103G, 103R in the color filter array 103. The material layer 121 may be formed of any opaque material, such as, for example, a metal, metal alloy, metal silicides, aluminum, or other opaque material. The material layer 121 may also be formed of a polysilicon material, which is opaque at shorter wavelengths of incoming light. Alternatively, the material layer 121 could be formed of any material having reflective properties, such as, for example, metal compounds such as silver or aluminum. The material layer 121 can be deposited by conventional coating methods, including, but not limited to, spin-coating, spray-coating, and ink jet coating methods.

An optional step of planarizing the material layer 121 can be employed for further processing of the imager 100 (FIGS. 1A and 1B). The planarization of the material layer could be performed by chemical mechanical polishing (CMP). Microlenses 101 (FIGS. 1A and 1B) are deposited, patterned, and reflowed to achieve the imager 100 illustrated in FIGS. 1A and 1B.

FIGS. 6A-7B illustrate a second fabrication embodiment for forming the imager 10 illustrated in FIGS. 1A and 1B. As illustrated in FIGS. 6A and 6B, which are partial top-down and side cross-sectional views, respectively, first, second, and third color filter precursors 103B', 103G', 103R' are formed adjacent to, and abutting one another. The first, second, and third color filter precursors 103B', 103G', 103R' are formed of a resist material, such as, for example, SB-3000L, SG-3000L and SR-3000L for blue, green, and red color filters, respectively. These materials typically contract by about 10% upon processing, for example, by being subjected to polymerizing conditions such as heat or ultraviolet radiation. Accordingly, it is possible to deposit first, second, and third color filter precursors 103B', 103G', 103R' having predetermined dimensions, and reduce the volume upon processing. For example, the illustrated first, second, and third color filter precursors 103B', 103G', 103R' are deposited to have a side cross-sectional width W2 of about 1000 nm, which have reduced volumes upon processing (as illustrated in FIGS. 7A and 7B).

As illustrated in FIGS. 7A and 7B, which are partial top-down and side cross-sectional views, respectively, the processing of the first, second, and third color filter precursors 103B', 103G', 103R' (FIGS. 6A and 6B) result in first, second, and third color filters 103B, 103G, 103R. Each of the first, second, and third color filters 103B, 103G, 103R has a side cross-sectional width W3 of about 900 nm (i.e., a reduction of 10% of 1000 nm). Accordingly, the first, second, and third color filters 103B, 103G, 103R are separated from one another by a distance D3 that is about 100 nm. Due to the contraction of the first, second, and third color filters 103B, 103G, 103R, sidewall regions 105B, 105G, 105R are exposed defining trenches 120 between each of the first, second, and third color filters 103B, 103G, 103R. The material layer 121 (FIGS. 5A and 5B) is subsequently deposited over each of the sidewall regions 105B, 105G, 105R, within the trenches 120, and over the first, second, and third color filters 103B, 103G, 103R, as discussed above with respect to FIGS. 5A and 5B.

FIGS. 8A and 8B illustrate a partial top-down view and side cross-sectional view (taken along line I-I of FIG. 8A), respectively, of a portion of a semiconductor-based imager 200, such as a CMOS imager, constructed in accordance with a second structural embodiment discussed herein.

FIGS. 8A and 8B illustrate the imager 200 that is substantially similar to the imager 100 discussed above with respect to FIGS. 1A-1B. The imager 200, however, has a material layer 221 formed between first, second, and third pixel cells 210b, 210g, 210r in the pixel cell array 210, which extends to a portion 104a below a topmost surface 104b of the fabrication layer 104. An optional etch stop layer 126 is formed within the fabrication layer 104 to aid in the processing of the FIG. 8B structure, as discussed below with respect to FIGS. 12A and 12B.

Figure 9A:
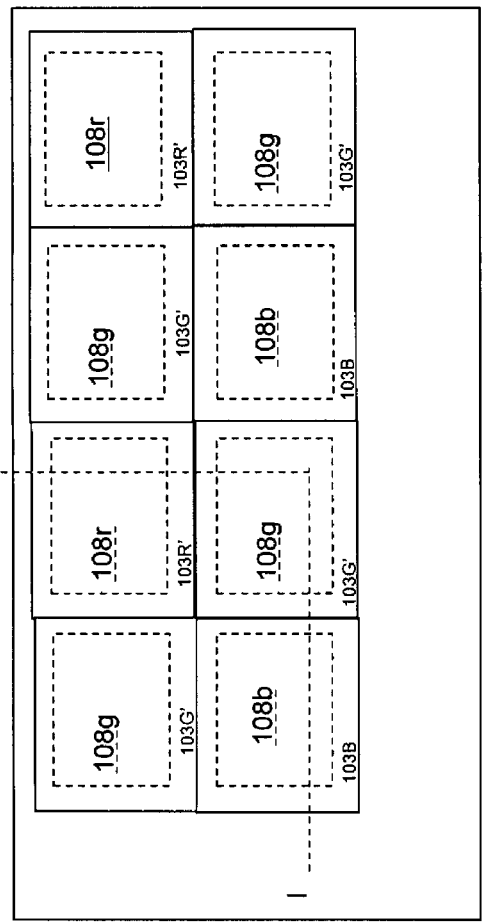
Figure 9B:
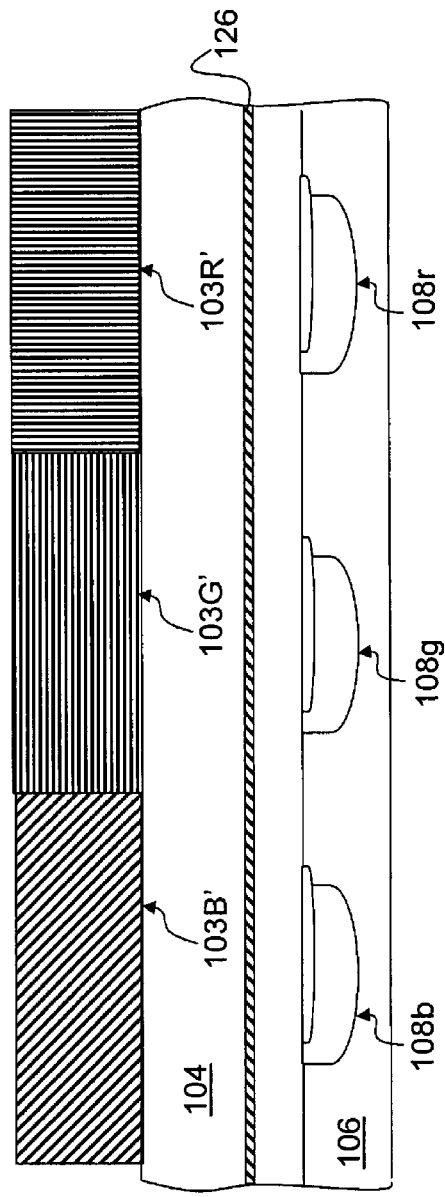

FIGS. 9A-12B illustrate an embodiment of fabricating the imager 200 illustrated in FIGS. 8A and 8B. FIGS. 9A and 9B, which are partial top-down and side cross-sectional views, respectively, illustrate the first, second, and third color filter precursors 103B', 103G', 103R' deposited adjacent to, and abutting one another. In the illustrated embodiment, the materials are selected to form the first, second, and third color filters 103B, 103G, 103R (FIGS. 8A and 8B) such that there is no contraction.

FIGS. 10A and 10B, which are partial top-down and side cross-sectional views, respectively, illustrate resist layers 125 deposited and patterned over the first, second, and third color filter precursors 103B', 103G', 103R'. The resist layers 125 could be formed of a material that polymerizes upon exposure to polymerizing conditions such as, for example, heat or ultraviolet radiation.

Figure 11A:
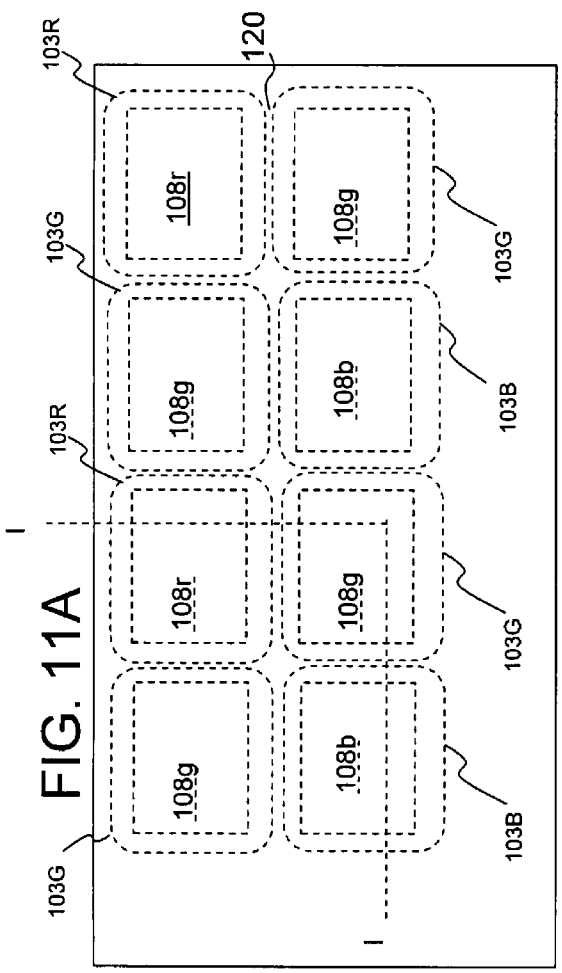
Figure 11B:
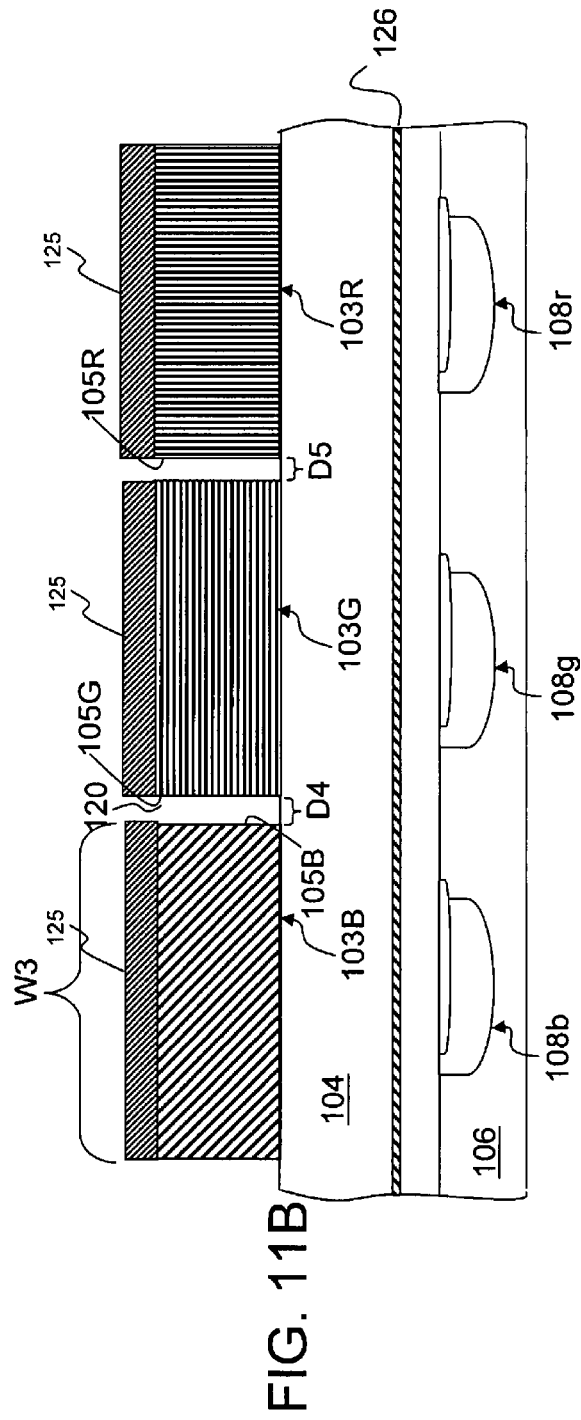

The exposed portions 103B", 103G", 103R" of the first, second, and third color filter precursors 103B', 103G', 103R', respectively, between the resist layers 125 are removed by conventional methods, such as, for example, a wet develop in dilute TMAH (tetramethylammonium hydroxide). As illustrated in FIGS. 11A and 11B, the removal of the portions 103B", 103G", 103R" result in the formation of the first, second, and third color filters 103B, 103G, 103R, and the exposure of sidewall regions (105B, 105G, 105R) for each color filter, which define trenches 120 in the FIG. 11B structure. The first and second color filters 103B, 103G are etched to have a predetermined distance D4 between them, and the second and third color filters 103G, 103R are etched to have a predetermined distance D5 between them. The predetermined distances D4 and D5 could be substantially the same or different, depending upon the intended application.

FIGS. 12A and 12B illustrate partial top-down and side cross-sectional views, respectively, of a further processing step of the structure illustrated in FIGS. 11A and 11B. Specifically, portions of the fabrication layer 104 below the color filter array 103 are removed by conventional techniques such as, for example, reactive ion etching, such that sidewall regions 107 of the fabrication layer 104 are exposed.

As a result of the processing, the sidewall regions 107 of the fabrication layer 104 are substantially aligned with the sidewall regions 105B, 105G, 105R of the first, second, and third color filters 103B, 103G, 103R. Together, the sidewall regions 107, 105B, 105G, 105R define trenches 120 between adjacent pixel cells (e.g., first, second, and third pixel cells 210b, 210g, 210r in the pixel cell array 210 of FIGS. 8A and 8B). The illustrated trenches 120 are defined by a topmost surface of the color filter array 103 and a portion 104a of the fabrication layer 104.

In the illustrated embodiment, the etch stop layer 126 is provided within the fabrication layer 104. The etch stop layer 126 indicates when the removal of the material layers (e.g., color filter materials and fabrication layer 104) should be terminated. FIGS. 13A and 13B illustrate the deposition of material layer 111 (FIGS. 8A and 8B) between each of the first, second, and third color filters 103B, 103G, 103R to fill the trenches 120 defined by the sidewall regions 107, 105B, 105G, 105R (FIG. 12B). The material layer 111 is deposited in a substantially similar manner as the material layer 121 discussed above with respect to FIGS. 5A and 5B (e.g., spin coating methods). As discussed above with respect to FIGS. 5A and 5B, the material layer 111 can be planarized by CMP to expose the topmost surfaces of the color filters.

Figure 14A:
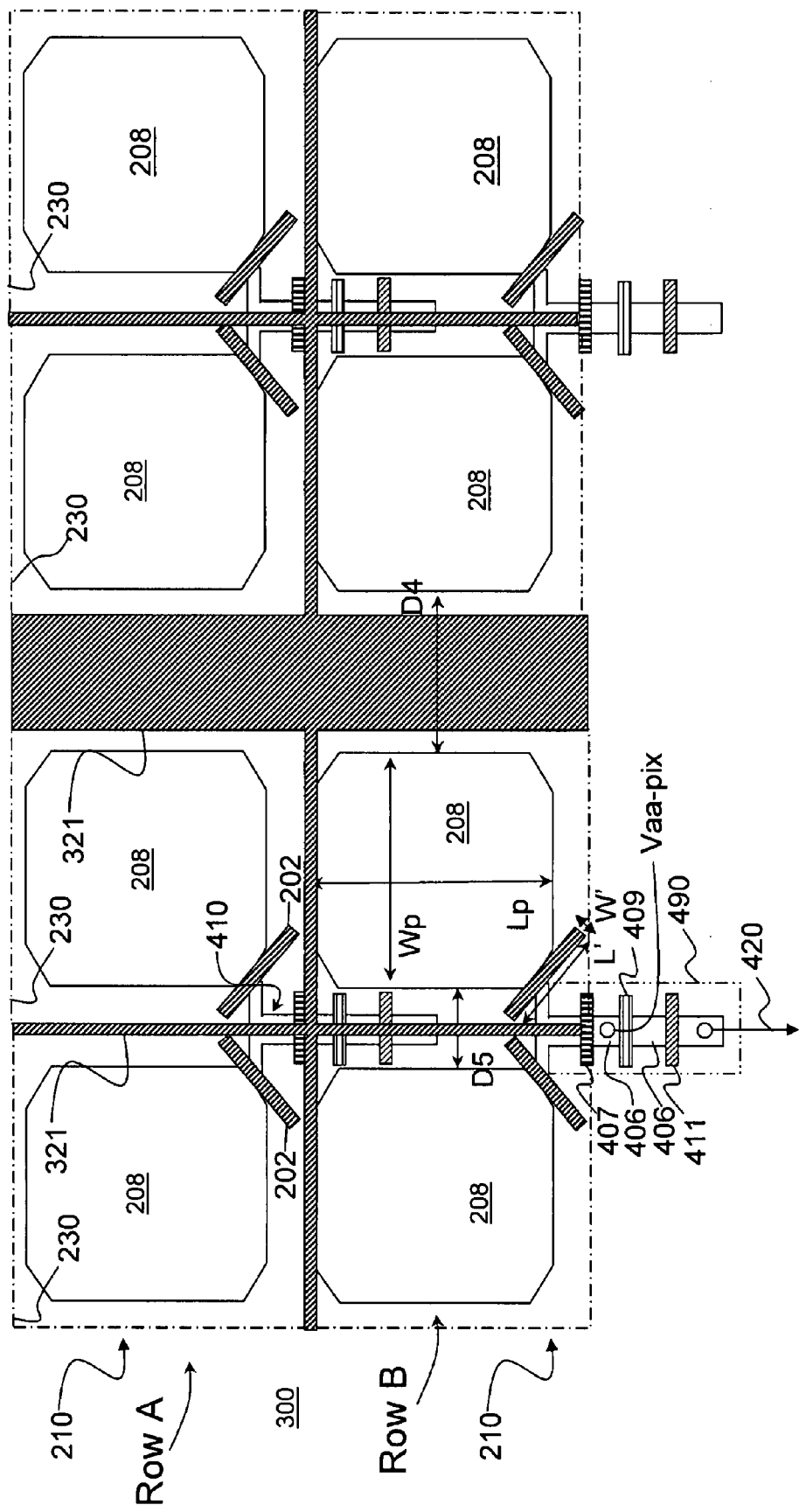
FIGS. 14A and 14B illustrate partial top-down and cross-sectional views of an imager constructed in accordance with a third structural embodiment discussed herein.
Figure 14B:
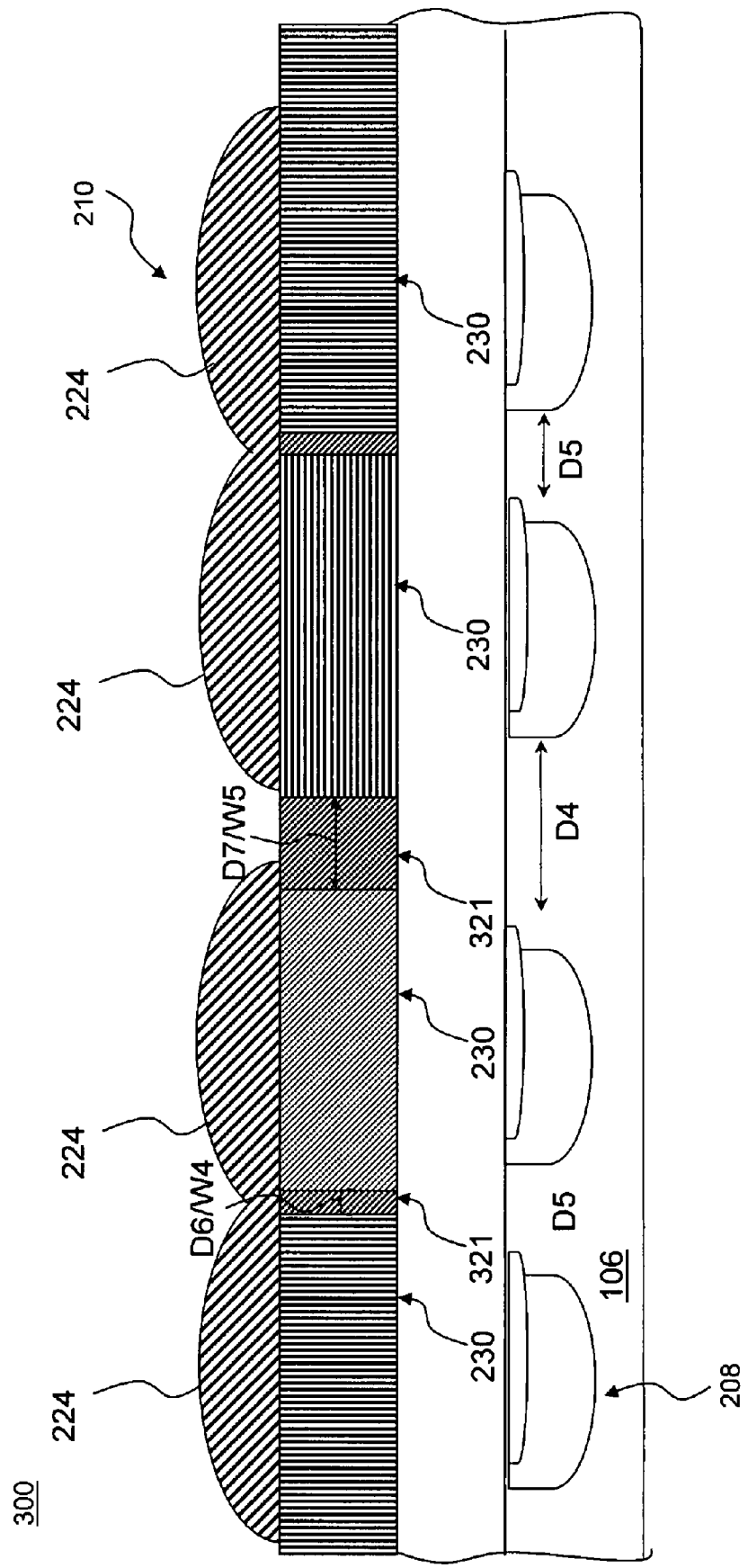

FIGS. 14A and 14B illustrate partial top-down and side cross-sectional views, respectively, of a portion of a semiconductor-based imager 300, such as a CMOS imager, constructed in accordance with a third structural embodiment discussed herein.

FIG. 14A illustrates a top-down magnified portion of eight pixel cells 210 arranged as four two-way shared pixel cells. Shared pixel cells have recently been introduced, and are further described in U.S. Publication Nos. 2007/0046796, 2007/0045685, and 20060027887, all of which are assigned to Micron Technology, Inc. The disclosures of each of the foregoing are hereby incorporated by reference in their entirety.

FIG. 14A illustrates two adjacent pixel cells 210 in one row (e.g., Row A) of the array share common pixel components. Each pixel cell 210 has an individual color filter 230 formed over a photosensor 208. The photosensors 208 may be any photosensitive structure for converting light radiation into electrons (photo-charges). Due to the proximity of each photosensor 208 sharing common pixel components, a light material layer 321 is deposited to avoid potential cross talk between the adjacent color filters.

For a CMOS imager, each pixel cell 210 may have a respective transfer gate 202 as part of a respective transfer transistors for transferring the accumulated photo-charges from the photosensors 208 to a common storage node, shown as floating diffusion region 410. The transfer gates 202 are angled from the photosensors 208. For example, the longitudinal extent L' of the transfer gates 202 is illustrated as being slanted with respect to the length Lp and the width Wp of the associated photosensors 208. The angular geometry of the transfer gate 202 allows for an efficient layout of the length L' and width W' of the transfer gate 102, which may improve the leakage and lag performance of the pixel cell 210. In addition, the angular layout is also beneficial in maximizing the fill factor of the pixel cell array, by maximizing the area of the photosensor 208 for each pixel cell 210.

The remaining pixel cell read out components shared between the adjacent pixel cells 210 are illustrated as being on a shared trunk 490, which is located between two column-adjacent pixel cells of a row, and also between pairs of row adjacent pixel cells of a row (e.g., Row B). The shared components on the trunk 490 include a floating diffusion region 410, which serves as a common storage node for the pixel cells 210 for receiving charges from photosensors 208 by the transfer gates 202. A reset transistor having a gate 407 is located on a side of the floating diffusion region 410 opposite the photosensors 208. A source/drain region 406 is located on a second side of the reset transistor gate 407, which is capable of receiving a supply voltage Vaa-pix. The floating diffusion region 410 is also electrically connected to the gate 409 of a source follower transistor, which has a drain coupled to the supply voltage Vaa-pix. The source follower transistor creates a voltage output signal based on stored charge on the floating diffusion region 410. A row select transistor having a gate 411 has a source/drain connected to the source of the source follower transistor, for selectively reading out the pixel signal to a column line 420. The shared pixel cell arrangement illustrated in FIG. 14A is merely exemplary. There are many different arrangements of shared pixel cell circuitry that may employ the light material layer 321 to isolate each pixel cell, thereby reducing optical cross talk.

As illustrated in FIG. 14B, each pixel cell 210 includes a microlens 224 formed over the color filters 230. Each color filter 230 is isolated by the material layer 321 to prevent cross-talk between adjacent pixel cells 230. The material layer 321 is formed in a substantially similar fashion as the embodiments discussed above with respect to FIGS. 1A and 1B (for example, the first fabrication embodiment discussed with respect to FIGS. 2A-5B). For example, the color filters 230 could be formed having various distances (e.g., D6 and D7) from each other, thereby defining trenches between the color filters. Subsequent processing steps include filling the trenches with material layer 321, and forming microlenses over respective photosensors 208 in the array. This processing results in material layer 321 having different side cross-sectional widths within the same array (e.g., W4 and W5) in the same array.

It should be noted that the imager 300 illustrated in FIGS. 14A and 14B could have the material layer 321 extend beyond an upper surface of the substrate 106 (as discussed above with respect to FIGS. 8A and 8B).

Figure 15:
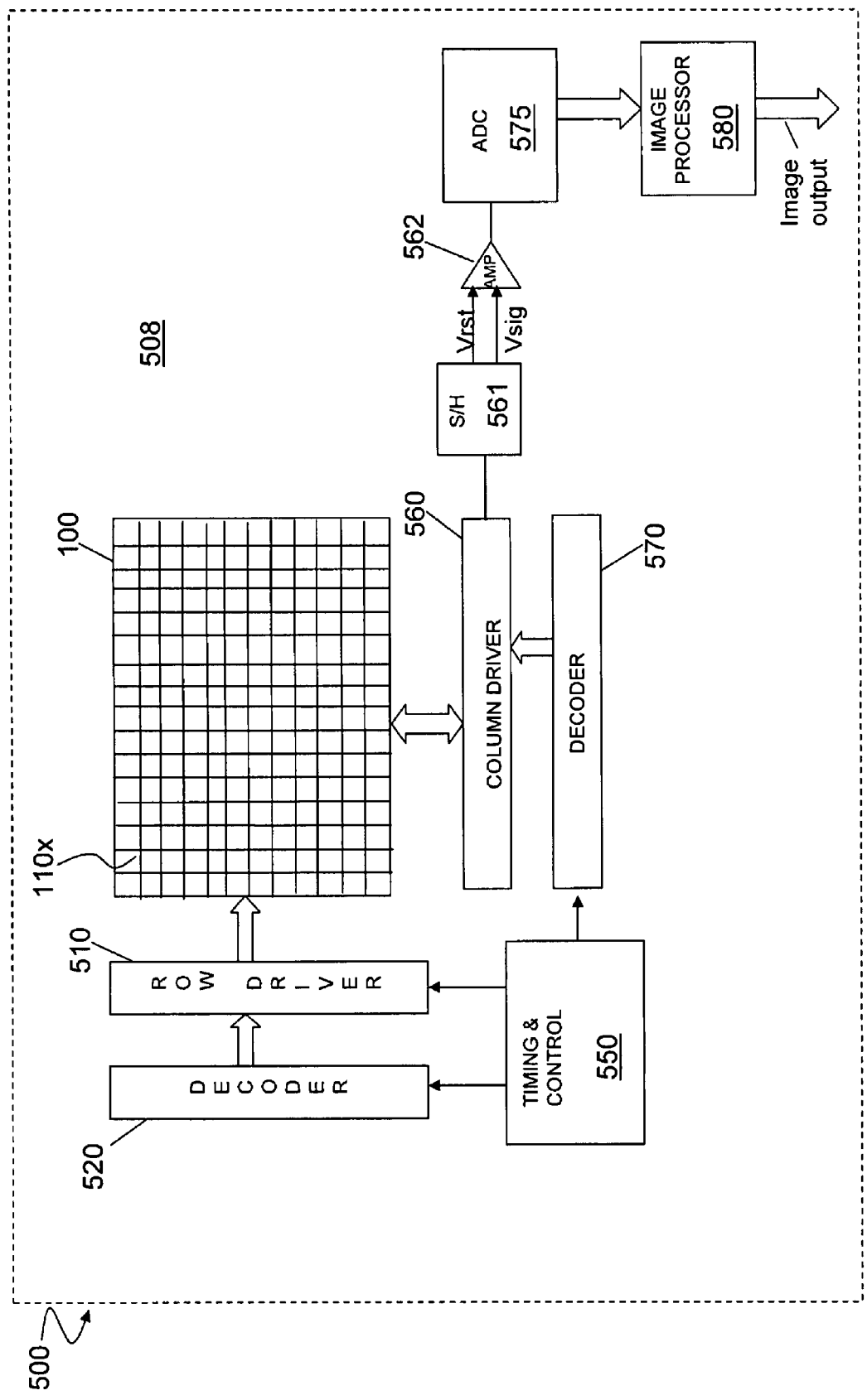
FIG. 15 is a partial top-down block diagram view of an imager device including the imager illustrated in FIGS. 1A and 1B.

FIG. 15 illustrates an imaging device 508 incorporating an imager 100, 200, 300 (of FIGS. 1A-14B) constructed in accordance with embodiments discussed above.

In operation of the FIG. 15 imaging device 508, the pixel cells 110x (representing any of the first, second, and third pixel cells of FIG. 1A) of each row in the imager 100 are all turned on at the same time by a row select line, and the pixel cells 110x of each column are selectively output by respective column select lines. A plurality of row and column lines are provided for the entire array. The row lines are selectively activated in sequence by the row driver 510 in response to row address decoder 520 and the column select lines are selectively activated in sequence for each row activation by the column driver 560 in response to column address decoder 570. Thus, a row and column address is provided for each pixel cells 110x. The imaging device 508 is operated by the control circuit 550, which controls address decoders 520, 570 for selecting the appropriate row and column lines for pixel readout, and row and column driver circuitry 510, 560, which apply driving voltage to the drive transistors of the selected row and column lines.

The pixel output signals typically include a pixel reset signal Vrst taken off of the floating diffusion region (via the source follower transistor) when it is reset and a pixel image signal Vsig, which is taken off the floating diffusion region (via the source follower transistor) after charges generated by an image are transferred to it. The Vrst and Vsig signals are read by a sample and hold circuit 561 and are subtracted by a differential amplifier 562, which produces a difference signal (Vrst−Vsig) for each pixel cells 110x, which represents the amount of light impinging on the pixel cells 110x. This signal difference is digitized by an analog-to-digital converter (ADC) 575. The digitized pixel signals are then fed to an image processor 580 to form a digital image output. In addition, as depicted in FIG. 15, the imaging device 508 may be included on a single semiconductor chip (e.g., chip substrate 500).

It should be noted that additional features of the circuitry of the FIG. 15 imaging device 508 are described in U.S. Pat. Nos. 6,140,630; 6,376,868; 6,310,366; 6,326,652; 6,204,524; 6,333,205; and 6,852,591, all of which are assigned to Micron Technology, Inc. The disclosures of each of the foregoing are hereby incorporated by reference in their entirety.

Figure 16:
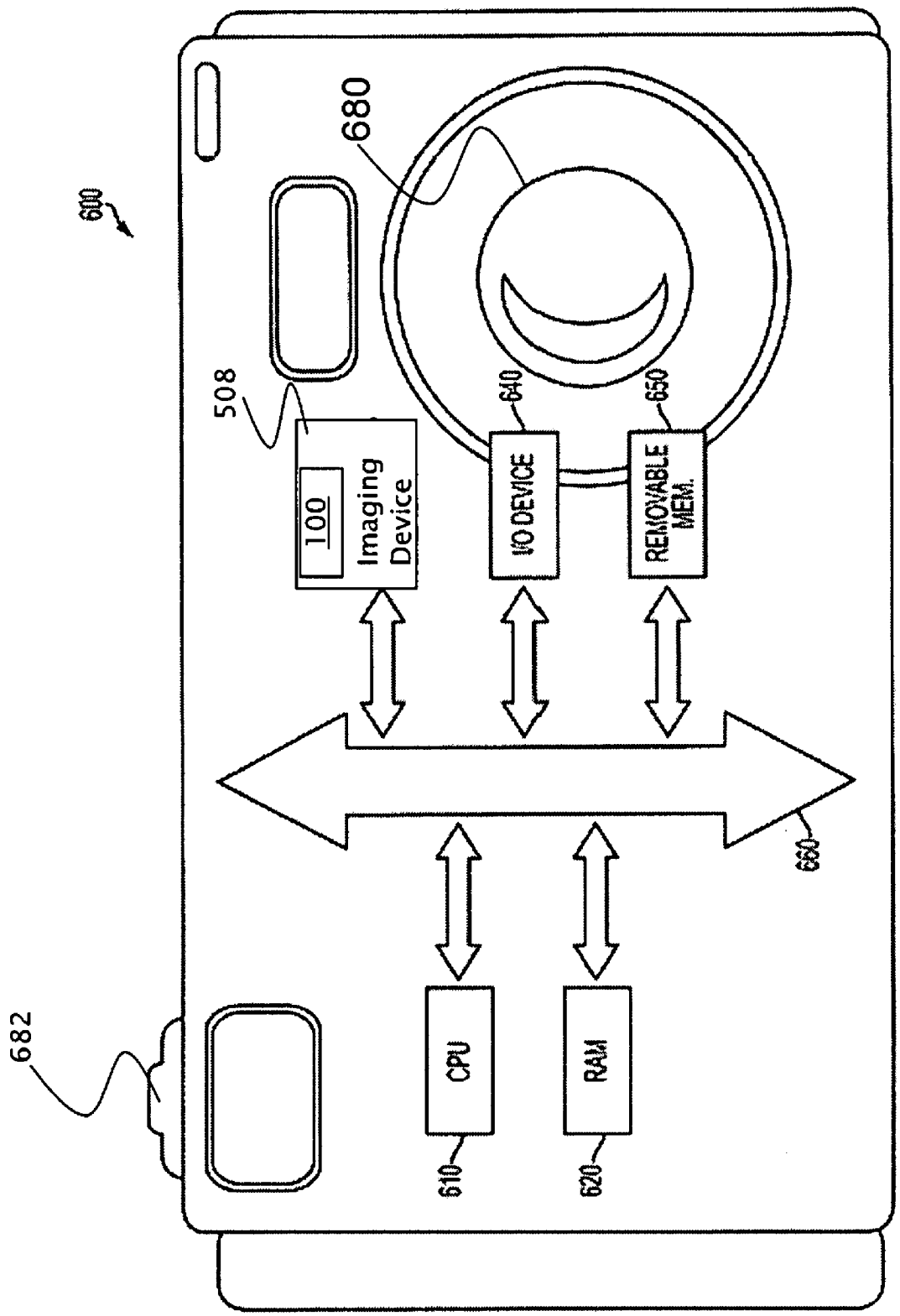
FIG. 16 illustrates a system having the imager device illustrated in FIG. 15.

FIG. 16 shows a typical system 600, such as, but not limited to, a camera system. The system 600 is modified to include an imaging device (such as the FIG. 15 imaging device 508). The system 600 is an example of a system having digital circuits that could include image sensor devices. Without being limiting, such a system could include a computer system, camera system, scanner, machine vision, vehicle navigation system, video phone, surveillance system, auto focus system, star tracker system, motion detection system, image stabilization system, and other systems employing an imager.

System 600, for example, a camera system, includes a lens 680 for focusing an image on imager 100, and generally comprises a central processing unit (CPU) 610, such as a microprocessor that controls camera functions and image flow, and communicates with an input/output (I/O) device 640 over a bus 660. CMOS imager device 508 also communicates with the CPU 610 over the bus 660. The processor-based system 600 also includes random access memory (RAM) 620, and can include removable memory 650, such as flash memory, which also communicate with the CPU 610 over the bus 660. The imaging device 508 may be combined with the CPU 610, with or without memory storage on a single integrated circuit or on a different chip than the CPU.

It should again be noted that although the embodiments have been described with specific references to CMOS imaging devices (e.g., 100, 200, 300 of FIGS. 1A-14B), they have broader applicability and may be used in any imaging apparatus. For example, embodiments may be used in conjunction with charge coupled device (CCD) imagers. The above description and drawings illustrate embodiments which achieve the objects, features, and advantages described. Although certain advantages and embodiments have been described above, those skilled in the art will recognize that substitutions, additions, deletions, modifications and/or other changes may be made.

What is claimed as new and desired to be protected by Letters Patent of the United States is:

1. A method of forming an integrated circuit, comprising:
   forming a plurality of pixel cells by:
   forming a plurality of photosensors arranged into a plurality of rows and columns in association with a substrate;
   forming a respective color filter above each photosensor, at least two of said color filters separated from each other by a distance in the range of about 50 nm to about 200 nm; and
   filling a space defined by the separation with a light blocking material, the step of filling the space performed by the act of spin-coating a light blocking material layer over the color filters,
   wherein forming the color filters at a distance from one another further comprises forming at least two adjacent and abutting color filters, and contracting the color filters to form the space.

2. The method of claim 1, wherein contracting the color filters is performed by exposing the color filters to polymerizing conditions.

3. The method of claim 2, wherein the act of exposing the color filters to polymerizing conditions comprises exposure to ultraviolet radiation.

4. The method of claim 2, wherein the act of exposing the color filters to polymerizing conditions comprises exposure to heat.

5. A method of forming an imager device, comprising:
   providing an integrated circuit capable of capturing images, and having a plurality of pixel cells, the pixel cells formed by:
   forming a plurality of photosensors arranged into a plurality of rows and columns in a substrate;
   forming color filters over the photosensors, at least two of said color filters separated from each other by a predetermined distance such that respective sidewall regions of the color filters are exposed, said exposure of said sidewall regions occurring upon processing color filtered materials for respectively forming said color filters which causes said materials to contract and form said color filters;
   forming a light shield over the sidewall regions of the color filters, the light shield formed by spin-coating an aluminum material layer over the color filters;
   planarizing the light shields to expose a topmost surface of the color filters; and
   providing read out circuitry for the pixel cells.

6. The method of claim 5, wherein said processing exposes the color filter materials to polymerizing conditions.

7. The method of claim 6 wherein the act of exposing the color filter materials to polymerizing conditions comprises exposure to ultraviolet radiation.

8. The method of claim 6, wherein the act of exposing the color filter materials to polymerizing conditions comprises exposure to heat.

9. The method of claim 5, wherein the predetermined distance is in the range of about 50 nm to about 200 nm.

10. A method of forming an imager; comprising:
    forming at least two adjacent color filters over respective photosensors by depositing respective color filter materials for each of the color filters and processing at least one of the respective color filter materials so it contracts to form a trench between said at least two adjacent color filters; and
    forming a material within the trench to optically isolate the adjacent color filters.

11. A method as in claim 10, wherein said processing comprises polymerization of the at least one color filter material.

12. A method as in claim 11, wherein said polymerization occurs in the presence of heat.

13. A method as in claim 11, wherein said polymerization occurs in the presence of ultraviolet radiation.

14. A method as in claim 10, further comprising processing each of said respective color filter materials so they contract to form said trench.

15. A method as in claim 10, wherein said respective color filter materials are deposited to abut one another.

16. A method as in claim 10, wherein first, second and third color filters are formed by depositing respective first, second and third different color filter materials to abut one another and processing said first, second and third color filter materials so they contract to form trenches between adjacent color filters, said method further comprising forming said optically isolating material within said trenches to optically isolate adjacent color filters.

\* \* \* \* \*